(12) United States Patent
Flores et al.

(10) Patent No.: US 7,791,190 B2
(45) Date of Patent: Sep. 7, 2010

(54) SUBSTRATE WITH CRYSTAL SILICON ARRAY

(75) Inventors: James S. Flores, Vancouver, WA (US); Yutaka Takafuji, Nara (JP); Steven R. Droes, Camas, WA (US)

(73) Assignee: Sharp Laboratories of America, Inc., Camas, WA (US)

(*) Notice: Subject to any disclaimer, the term of this patent is extended or adjusted under 35 U.S.C. 154(b) by 1197 days.

(21) Appl. No.: 10/884,660

(22) Filed: Jul. 2, 2004

(65) Prior Publication Data

US 2004/0238851 A1 Dec. 2, 2004

Related U.S. Application Data

(62) Division of application No. 10/376,776, filed on Feb. 27, 2003, now Pat. No. 6,759,277.

(51) Int. Cl.
*H01L 23/34* (2006.01)
(52) U.S. Cl. .................... 257/723; 257/E21.6; 257/714
(58) Field of Classification Search .......... 257/E21.133, 257/E21.413, E21.703, E29.295, 724, 678, 257/202, 685, 723, E21.601, E21.6, 714; 438/149; 359/296; 206/714
See application file for complete search history.

(56) References Cited

U.S. PATENT DOCUMENTS

| | | | | |
|---|---|---|---|---|
| 4,035,065 A * | 7/1977 | Fletcher et al. | ............. | 359/848 |
| 4,604,519 A * | 8/1986 | Zollman et al. | ....... | 250/214 VT |
| 4,891,522 A * | 1/1990 | Coon et al. | ............. | 250/370.1 |
| 5,232,532 A * | 8/1993 | Hori | ............. | 156/163 |
| 5,266,828 A * | 11/1993 | Nakamura et al. | ............. | 257/432 |
| 5,510,273 A * | 4/1996 | Quinn | ............. | 156/160 |
| 5,745,046 A * | 4/1998 | Itsumi et al. | ............. | 340/5.83 |
| 5,748,161 A * | 5/1998 | Lebby et al. | ............. | 345/84 |
| 5,776,803 A * | 7/1998 | Young | ............. | 438/149 |
| 5,888,884 A * | 3/1999 | Wojnarowski | ............. | 438/462 |
| 6,399,429 B1 * | 6/2002 | Yamoto et al. | ............. | 438/166 |
| 6,486,917 B2 * | 11/2002 | Iwasaki | ............. | 348/375 |
| 6,642,083 B2 * | 11/2003 | Miyazaki et al. | ............. | 438/117 |
| 6,661,563 B2 * | 12/2003 | Hayashi et al. | ............. | 359/296 |
| 6,791,072 B1 * | 9/2004 | Prabhu | ............. | 250/208.1 |
| 6,839,135 B2 * | 1/2005 | Hamm et al. | ............. | 356/328 |
| 6,881,943 B1 * | 4/2005 | Yegnashankaran | ............. | 250/208.1 |
| 7,190,039 B2 * | 3/2007 | Boettiger et al. | ............. | 257/432 |
| 2001/0020671 A1 * | 9/2001 | Ansorge et al. | ............. | 250/208.1 |
| 2001/0046081 A1 * | 11/2001 | Hayashi et al. | ............. | 359/296 |

* cited by examiner

*Primary Examiner*—Chris Chu
(74) *Attorney, Agent, or Firm*—Law Office of Gerald Maliszewski; Gerald Maliszewski

(57) ABSTRACT

An array of crystalline silicon dies on a substrate and a method for yielding the array are provided. The method comprises: delineating an array of die areas on a crystalline semiconductor wafer; implanting the die areas with hydrogen ions; overlying the die areas with a layer of polymer to form, for each die, an aggregate including a die area first wafer layer; polymerically bonding an optically clear carrier to the die areas; thermally annealing the wafer to induce breakage in the wafer; forming, for each die, an aggregate wafer second layer with a thickness less than the die thickness; and, for each die, conformably attaching the aggregate wafer second layer to a substrate. The substrate can have an area of up to approximately two square meters and the wafer second layer can have a thickness of greater than and equal to approximately 20 nanometers.

4 Claims, 8 Drawing Sheets

IMPLANTING THE DIE AREAS WITH HYDROGEN IONS

OVERLYING THE DIE AREAS WITH A FIRST LAYER OF POLYMER TO FORM, FOR EACH DIE, AN AGGREGATE

POLYMER BONDING A FIRST OPTICALLY CLEAR CARRIER OVERLAYING THE DIE AREAS

THERMALLY ANNEALING THE CRYSTALLINE WAFER TO INDUCE BREAKAGE IN THE WATER

MECHANICALLY CONTROLLING THE FIRST CARRIER
AND VAPORIZING THE AGGREGATE POLYMER LAYER
WITH A LASER TO PROPEL THE DIE UNTO
THE DESIRED POSITION ON THE SUBSTRATE

MOVING CARRIER TO NEXT DESIRED
SPOT AND REPEATING FIG. 8

THE ARRAY AWAITING CLEANING AFTER
ALL DIES HAVE BEEN DISTRIBUTED

TRANSFERRING THE SILICON LAYER TO A SECOND CARRIER AND, AFTER TRANSFER, REMOVING THE FIRST CARRIER AND RESIN

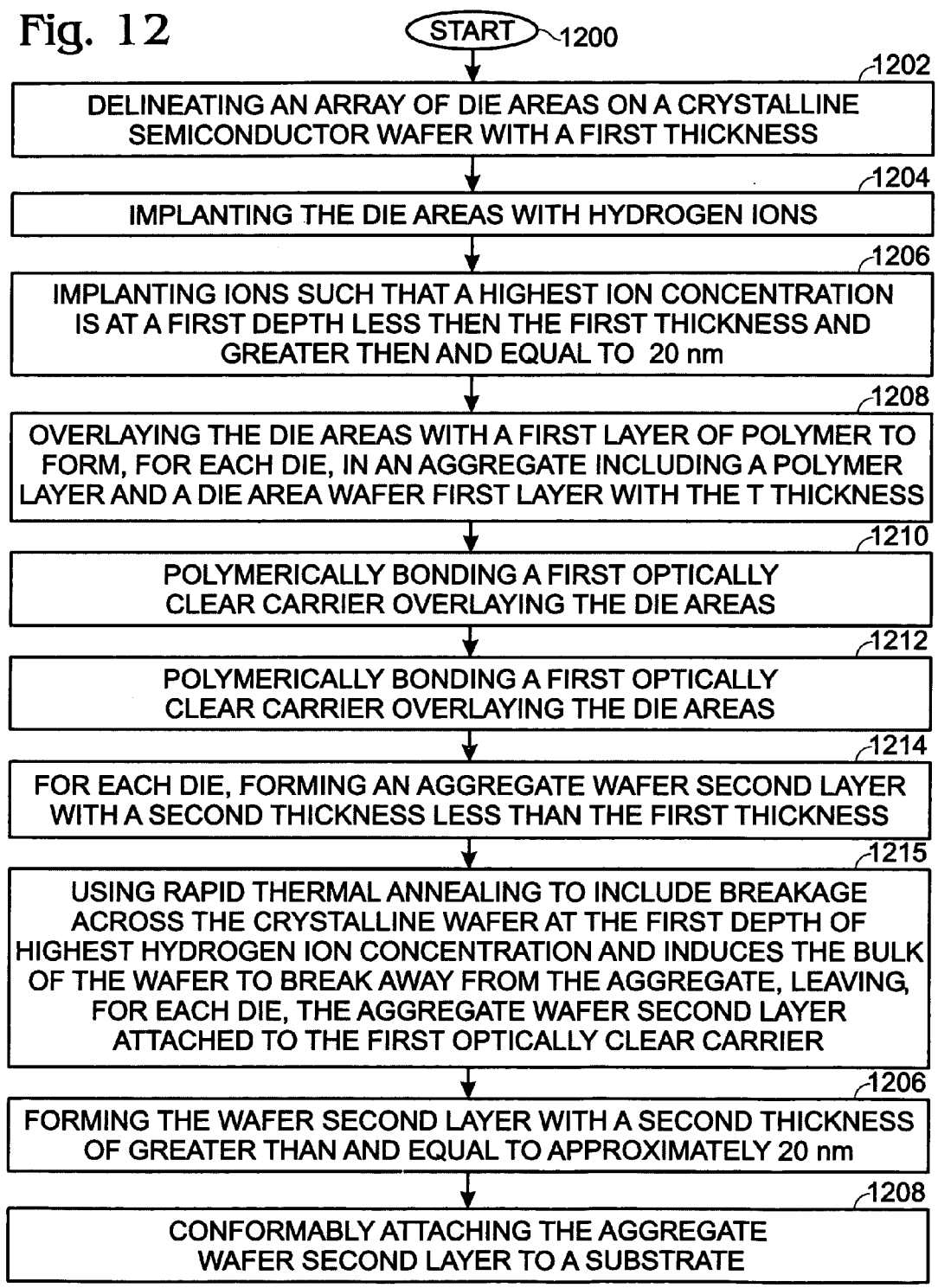

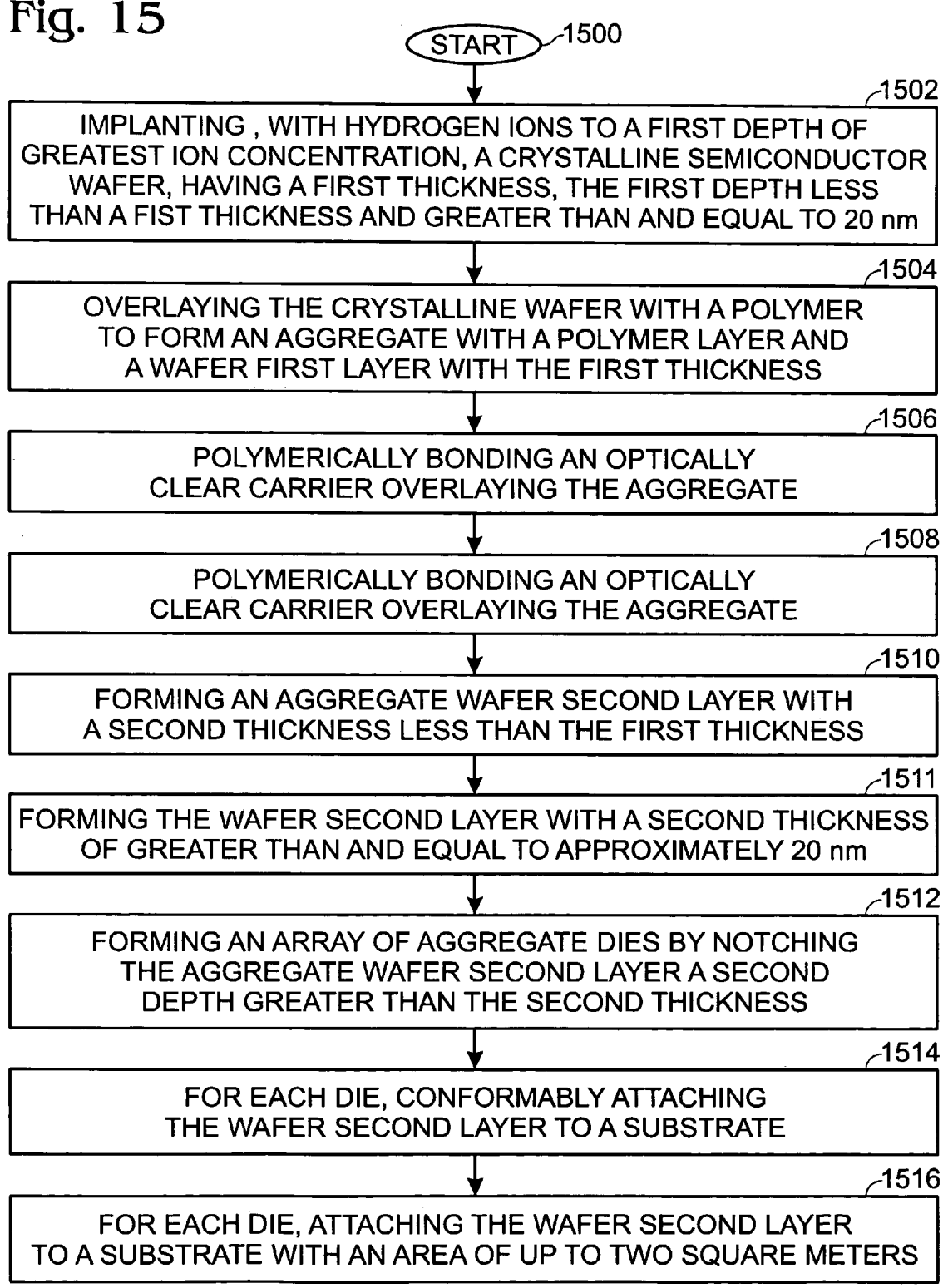

SUBSTRATE WITH CRYSTAL SILICON ARRAY

CROSS REFERENCE TO RELATED APPLICATIONS

This application is a divisional of application Ser. No. 10/376,776, filed Feb. 27, 2003 entitled "Crystalline Silicon Die Array and Method for Assembling Crystalline Silicon Sheets Onto Substrates," invented by Flores et al., now U.S. Pat. No. 6,759,277.

BACKGROUND OF THE INVENTION

1. Field of the Invention

This invention generally relates to the fabrication of integrated circuit (IC) devices and, more particularly, to the assembly of thin sheets of single crystal silicon onto substrates.

2. Description of the Related Art

The use of substrate materials other than silicon is of interest, as it would enable the realization of new display products that are not otherwise feasible to make. For example, there is broad agreement in the flat panel display (FPD) industry that system-on-glass (SOG) technology is a natural evolutionary step for FPDs, especially for mobile devices. As an example of this evolution, improvements in liquid crystal display (LCD) technology create a need for high performance thin film transistor (TFT) driver components on transparent substrates such as glass and polymer. In fact, SOG is a natural confluence of display and microprocessor evolution, because integration is a proven solution for greatly reducing costs while improving the compactness and reliability of electrical systems.

Another aspect of interest is flexibility, the ability of a microsystem to bend, conform, or maintain its integrity under external "stress". These attributes would enable the manufacturing of a variety of one-use products and/or the manufacturing of robust products that maintain their functionality under a wide range of external, "environmental" conditions. Therefore, there is motivation to develop Microsystems or products that use TFT microelectronic devices that are robust, have high performance, and are cheap to make.

Low-temperature polysilicon (LTPS) technology uses a laser beam to crystallize amorphous silicon and form thin polycrystalline silicon layers, also referred to as polysilicon layers. Display drivers and analog-to-digital converters for SOG devices can be formed in this manner. Unfortunately, this approach remains relatively expensive for LCD production. Moreover, polysilicon TFTs formed by LTPS technology may not provide the capability to realize sophisticated functions like central processor unit (CPU) operations and digital signal processing. Finally, the steadiness of drive currents produced by polysilicon TFTs may be inadequate for organic light emitting diode displays (OLEDs).

It would be advantageous if a process could inexpensively use SOG technology to produce TFTs able to implement sophisticated functions like CPU and digital signal processing.

It would be advantageous if a process could inexpensively use SOG technology to produce TFTs with drive currents sufficient for OLEDs.

It would be advantageous if a process could inexpensively produce TFT microelectronic devices on flexible substrates.

SUMMARY OF THE INVENTION

The present invention describes an array of crystalline silicon dies with thicknesses of 20 nanometers (nm) or more on a substrate with an area of up to two square meters. The present invention also describes a method for yielding the above-mentioned array. The present invention is accomplished using rapid thermal breakage of a crystalline silicon wafer, rapid mechanical placement of the dies on the substrate, and intermolecular bonding of the dies to the substrate. The present invention allows the formation of integrated circuit devices, such as thin film transistors, on transparent or flexible substrates.

Accordingly, a method is provided for assembling crystalline semiconductor thin film sheets onto substrates. The method delineates an array of die areas on a crystalline semiconductor wafer and implants the die areas with hydrogen ions. Then, the die areas are overlain with a layer of polymer to form, for each die, an aggregate including a polymer layer and a die area wafer first layer. An optically clear carrier is polymerically bonded to the die areas and the crystalline wafer is thermally annealed to induce breakage in the wafer. For each die, a wafer second layer with a thickness less than the die thickness is formed and, for each die, the wafer second layer is conformably attached to a substrate using intermolecular bonding.

The wafer second layer can be attached to a substrate with an area of up to approximately two square meters and the wafer second layer can have a thickness of greater than or equal to approximately 20 nm.

The wafer second layer can be conformably adapted to a substrate interface surface with a concavity or curvature. In some aspects of the method, the substrate is transparent, such as a glass substrate. In some aspects, the substrate is flexible, such as a plastic substrate.

Additional details of the above-described method and an array of crystalline silicon dies on a substrate are presented in detail below.

BRIEF DESCRIPTION OF THE DRAWINGS

FIG. 12 is a flowchart illustrating the present invention method for assembling crystalline semiconductor thin film dies onto substrates.

FIG. 15 is a flowchart illustrating the present invention method for assembling crystalline semiconductor thin film dies onto substrates.

DETAILED DESCRIPTION OF THE PREFERRED EMBODIMENTS

The use of single crystal silicon can resolve the thin film transistor and organic light emitting diode display problems noted in the Background Section. Although there currently are techniques for creating films of single crystal silicon on transparent or flexible substrates, there also are problems and limitations associated with these techniques. One such technique is Fluidic-Self-Assembly™ (FSA) by Alien Technology. FSA works best for silicon layers of more than 50 microns. Unfortunately, such blocks constitute a "bulk silicon integrated circuit", and, consequently, exhibit undesirable capacitive effects that are substantial compared to silicon-on-insulator devices. Also, FSA placement depends on random probability and gravity to move the blocks to their desired locations. As a result, more than 80% of the blocks do not settle in their desired locations and, therefore, need to be recycled or disposed. Thus, FSA placement requires a large number of blocks to populate the desired locations. If smaller blocks are used, Brownian motion further disrupts precise placement and more time is required for settlement. Finally, if glass substrates are desired, it is difficult to efficiently etch precisely sized holes. Other rapid assembly techniques, like capillary self-assembly, require fluid and, typically, the use of surfactants, adding further complication and expense to the process. These techniques also remain susceptible to Brownian motion.

Researchers have developed a means of creating a thin film of single crystal silicon by inducing a horizontal stress fracture with a high dose hydrogen implantation. Typically, such films are transferred to a substrate using wafer bonding, which depends on the transference of a layer that spans the entire planar interface between two stiff substrates. Unfortunately, the film typically cannot conform to differences between non-planar features, such as concavities, in each substrate surface, impairing adhesion. Since non-planar features typically increase in proportion to increases in substrate surface area, wafer bonding is ineffective for flat panel display (FPD) panels, which may be up to approximately one square meter in area.

Figure 1:
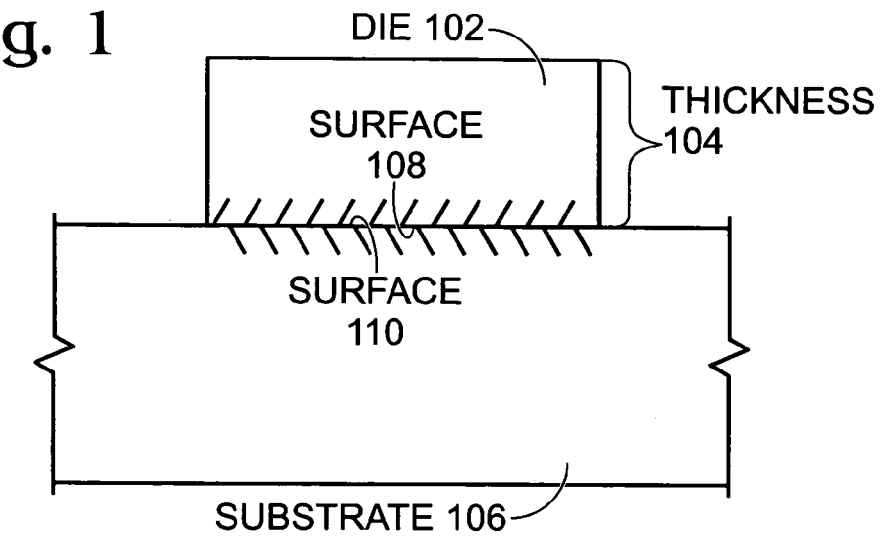
FIG. 1 is a partial cross-sectional view of a crystalline silicon die in the present invention array of crystalline silicon dies.

FIG. 1 is a partial cross-sectional view of a crystalline silicon die in the present invention array of crystalline silicon dies. FIG. 1 (and FIGS. 2 through 11 below) is not drawn to scale. A crystalline silicon die 102 with a thickness 104 overlies a substrate 106. The thickness 104 is greater than and equal to approximately 20 nanometers (nm). By that we mean the thickness 104 is 20 nm or more. The die 102 includes a surface 108 and the substrate 106 includes a surface 110. The surfaces 108 and 110 are generally in full contact.

Figure 2:
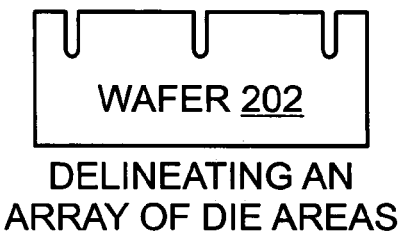
FIG. 2 is partial cross-sectional view showing delineation of an array of die areas.

FIG. 2 is partial cross-sectional view showing delineation of an array of die areas. FIG. 2 is used to illustrate the production of the crystalline silicon die 102 shown in FIG. 1, in order to attain a clearer understanding of the die 102 characteristics. Typically, an array (not shown) of crystalline silicon dies, such as die 102, may include a large number of individual dies. For example, as shown in FIG. 2, dies in an array are formed from a silicon wafer 202 (only a portion of which is shown in FIG. 2). A typical area for die 102 could be approximately one square centimeter. Therefore, in the case of a 12 inch diameter wafer 202, an array could include 730 dies. However, due to similarities in the dies, it is not necessary to show all the dies in an array and the present invention can be understood by depicting only the die 102. It is understood, however, that the present invention is not limited to any particular number of dies. It also is understood that the individual dies in an array also can vary from one another in shape, dimensions and function.

Returning to FIG. 1, the die 102 (and the remaining dies (not shown) in an array of crystalline silicon dies) can be placed on a substrate 106 with an area of up to approximately two square meters. The relatively large substrate area enables an array to be used in large flat screen display applications, such as liquid crystal display (LCD) screens.

Figure 3:
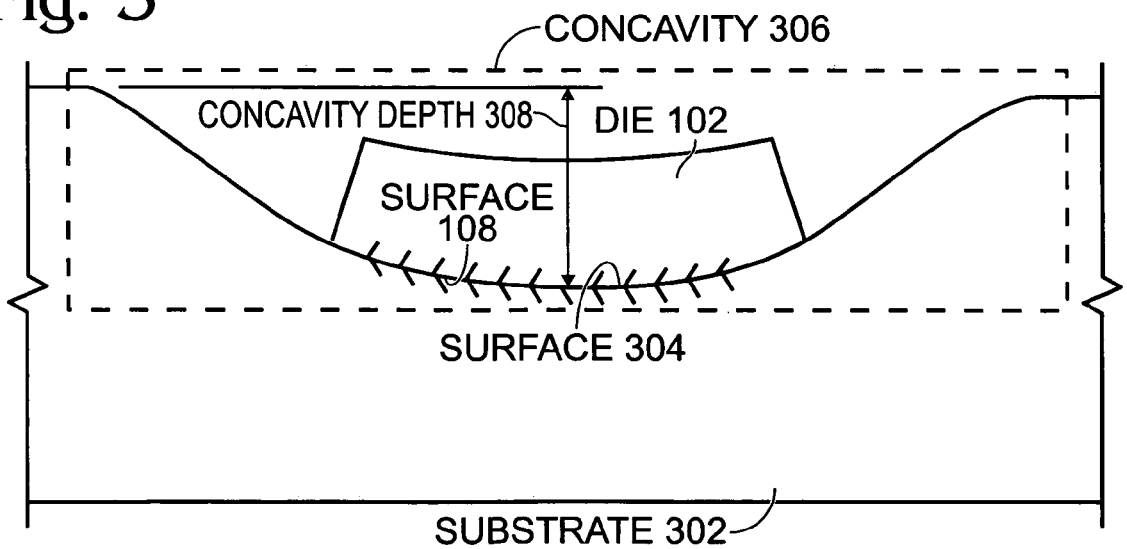
FIG. 3 is a partial cross-sectional view of a concavity in the substrate for the crystalline silicon die shown in FIG. 1.

FIG. 3 is a partial cross-sectional view of a concavity in the substrate for the crystalline silicon die shown in FIG. 1.

Figure 4:
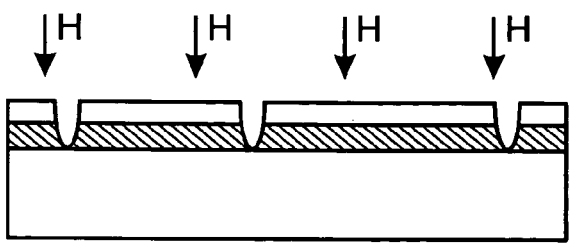
FIGS. 4 through 10 are partial cross-sectional views showing steps in the completion of the present invention array of crystalline silicon dies.

FIG. 4 is a partial cross-sectional view showing implantation of the die areas with hydrogen ions.

Figure 5:
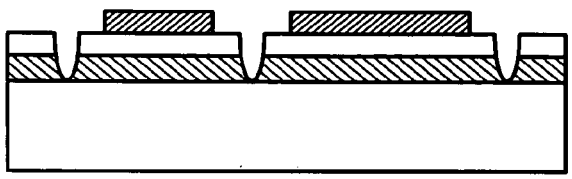

FIG. 5 is a partial cross-sectional view showing the die areas being overlain with a first layer of polymer to form, for each die, an aggregate.

Figure 6:
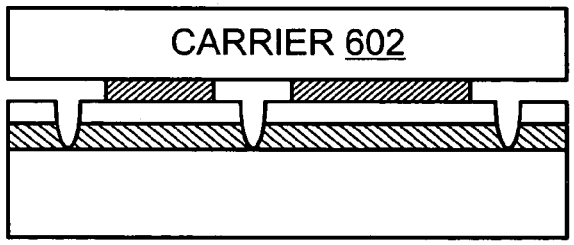

FIG. 6 is a partial cross-sectional view showing polymeric bonding of a first optically clear carrier overlying the die areas.

Figure 7:
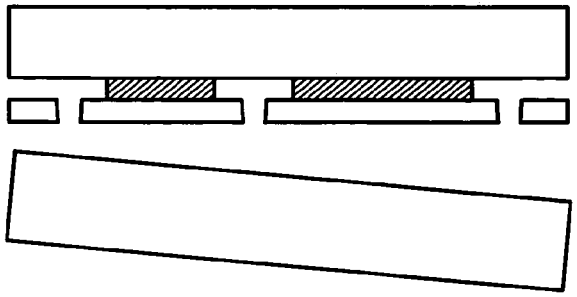

FIG. 7 is a partial cross-sectional view showing thermal annealing of the crystalline wafer to induce breakage in the wafer.

Figure 8:
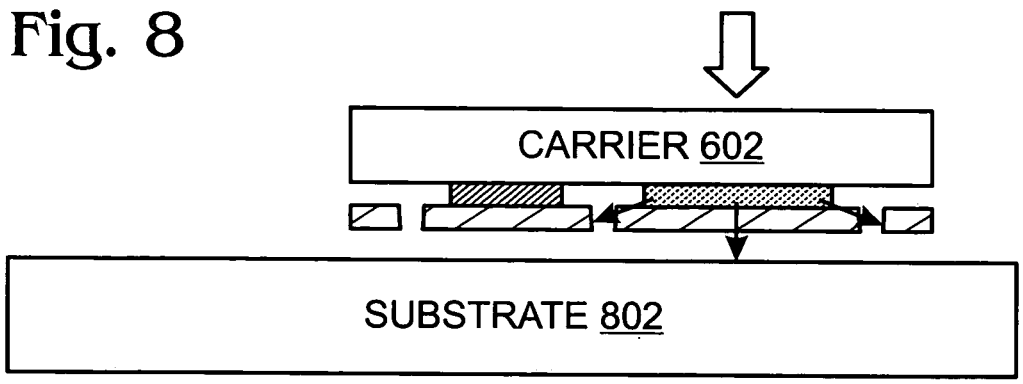

FIG. 8 is a partial cross-sectional view showing mechanical control of the first carrier and vaporization of the aggregate polymer layer with a laser to propel the die unto the desired position on the substrate. The carrier 602 can typically be positioned up to approximately one millimeter (mm) above the substrate 802. The approximately one mm distance is chosen as the typical distance up to which the accuracy of the placement of dies on the substrate 802 may be maintained.

Figure 9:
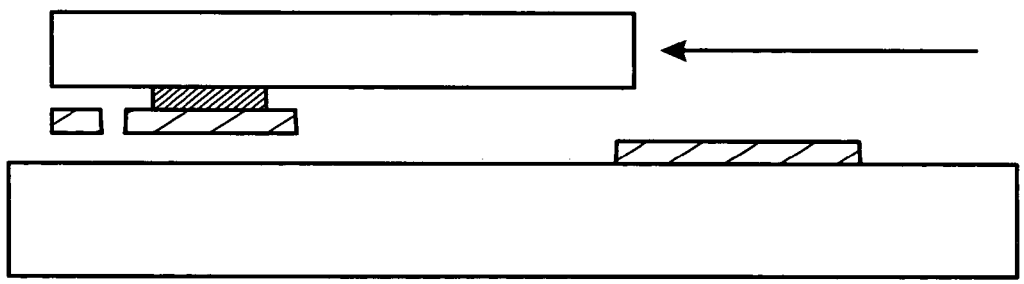

FIG. 9 is a partial cross-sectional view showing the carrier being moved to the next desired spot and the repeat of operations shown in FIG. 8.

Figure 10:
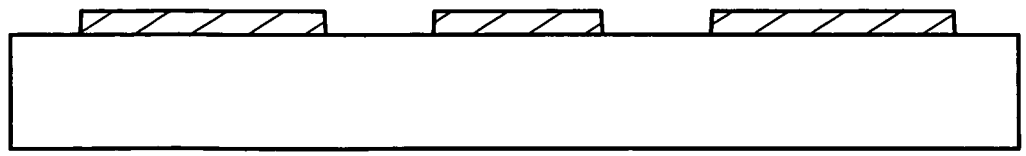

FIG. 10 is a partial cross-sectional view showing the array awaiting cleaning after all dies have been distributed. FIGS. 4-10 are used to illustrate the production of the crystalline silicon die 102 shown in FIGS. 1 and 3, in order to attain a clearer understanding of the die 102 characteristics.

Returning to FIG. 3, a substrate 302 includes a surface 304 and a concavity 306. The concavity 306 has a depth 308. The surfaces 108 and 304 are generally in full contact. That is, the die 102 is adapted so that the surface 108 maintains contact with the surface 304 regardless of the concavity 306. This occurs for two reasons. First, when the surfaces 108 and 304 come into contact, the die 102 is unconstrained by the surface of any carriers or intermediate substrates involved in the processing of the die, as shown in FIG. 8. That is, the die 102 is separated from the carrier 602. Second, the relative thinness of the die 102, as described for FIG. 1, makes the die 102 relatively malleable and, therefore, more conformable to non-planar features such as the concavity 306. Thus, the freedom of the die 102 from a carrier or substrate enables the die 102 to conform to the substrate 302 to the extent possible given the inherent malleability of the die 102. Further, the die 102 has a relatively small area with respect to the substrate 302. Therefore, the die 102 only conforms to a relatively small portion of the total surface (not shown) of the substrate 302, reducing the amount of adaptation required by the die 102. In contrast, as discussed in the Background Section, films transferred to a substrate using wafer bonding span the entire planar interface between two stiff substrates and typically cannot completely conform to differences between non-planar features in substrate surfaces.

It should be understood that the concavity 306 is presented only for purposes of illustrating the adaptability of the die 102. Thus, it should be further understood that the adaptability of the present array of dies is not limited to concavities, such as concavity 306, and is applicable to substrates with a wide variety of non-planar features having a wide range of shapes, including convexities.

The range of up to approximately one mm for the concavity depth 308 is related to the preferred maximum distance of one mm between a carrier and a substrate during transfer of a die to the substrate, as noted above for FIG. 8. In this context, the concavity depth can be thought of as the distance from a carrier to the "bottom" of a concavity in a substrate once the carrier has been lowered to the full extent possible. Typically, this means the carrier is lowered as far as possible without contacting the substrate surface. For the case in which the diameter of a concavity is less than the diameter of a carrier (the carrier cannot be lowered into the concavity), the concavity depth is the approximate distance from substrate surfaces surrounding the concavity to the "bottom" of the concavity. This is the case shown in FIG. 3. For the case in which a concavity has a diameter greater than the diameter of a carrier (not shown), the maximum concavity depth is the approximate distance from the carrier to the "bottom" of the concavity once the carrier is lowered as far as possible into the concavity without contacting the sides of the concavity. In this case, the distance from substrate surfaces surrounding the concavity to the "bottom" of the concavity is greater than one mm, since the carrier is lowered into the concavity. In general, there are no limitations regarding the shape of a concavity and the ability of a die to conform to the concavity. That is, a die is malleable enough to conform to any substrate concave shapes that are typically encountered in production operations.

The array is generally adaptable to convexities in a substrate. Since convexities rise above the surface of a substrate, a substrate surface does not interfere with the positioning of a carrier and the carrier can be lowered to a desired height above the convexity. As described above for concavities, a die is malleable enough to conform to any substrate convex shapes that are typically encountered in production operations.

Non-planar surface features, such as the concavity 306, are not typically an intentional feature of a substrate. In some cases, however, non-planar features in a substrate may be intentional, for example, in roll-to-roll processing (not shown). For roll-to-roll processing, a substrate will have a predetermined convex curvature with respect to a carrier. For intentional convexities and concavities in substrates, the discussion above for non-intentional non-planar features is applicable.

The die 102, and any other dies included in an array, is accurately placed in its desired location on substrate 106 by a deterministic process, as shown in FIGS. 6, 8, and 9. That is, the placement of dies does not depend on random probability or gravity. For example, as shown in FIG. 6, each die is bonded to a transparent carrier 602 with a layer of polymer and, as shown in FIG. 8, the carrier 602 and die are mechanically moved to a point above the desired die location on a substrate 802. Then, as shown in FIG. 8, the die is propelled to the desired location by vaporizing the polymer layer. A polymer layer does not necessarily cover the entire surface of a die. That is, the layer can be partial.

Returning to FIGS. 1 and 3, the substrates 106 and 302 can be transparent or flexible, but are not limited to these materials. In some aspects, a transparent substrate 106 or 302 is glass. A transparent substrate 106 or 302 facilitates the use of the die 102 in display devices, such as devices with LCDs. In some aspects, a flexible substrate 106 or 302 is plastic.

Figure 11:
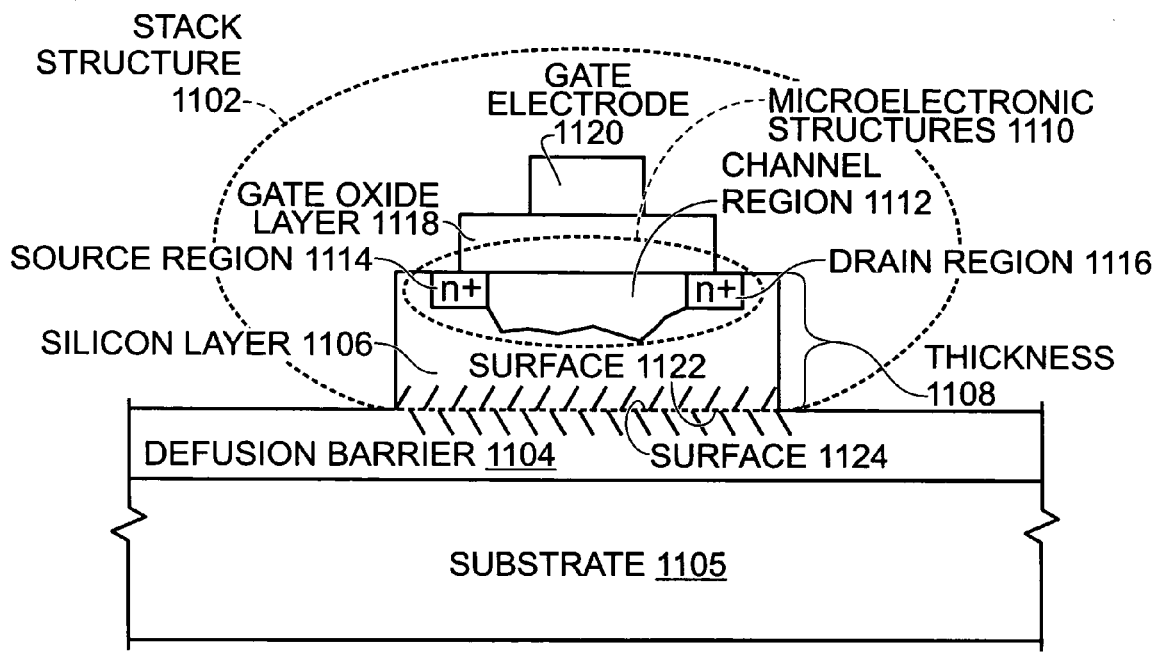
FIG. 11 is a partial cross-sectional view of an integrated circuit stack structure in the present invention array of integrated circuit stack structures.

FIG. 11 is a partial cross-sectional view of an integrated circuit stack structure in the present invention array of integrated circuit stack structures. It should be understood that the integrated circuit stack structure of FIG. 11 is offered only as one illustration of the invention. Other stack structures that can be built within a silicon layer having a depth of up to a few microns, such as those for bipolar transistors, field effect transistors, photovoltaic elements, and charge-coupled devices (CCDs), also are included in the present array. Integrated circuit stack structure 1102 overlies a diffusion barrier 1104, which in turn, overlies a substrate 1105. The discussion for FIG. 1 regarding the number, shape, dimension, and function of dies in an array also is applicable to an array of stack structures. Therefore, as in FIG. 1, the present invention can be understood by depicting only the stack structure 1102. It is understood, however, that the present invention is not limited to any particular number of stack structures. It also is understood that the individual stack structures in an array also can vary from one another in shape, dimensions, and function. As discussed above for substrate 106, the substrate 1105 can have an area up to approximately two square meters. Structure 1102 includes a crystalline silicon layer 1106 with a thickness 1108 greater than and equal to approximately 20 nm. By that we mean the thickness 1108 is 20 nm or more. The silicon layer 1106 includes microelectronic structures 1110. In some aspects, the structures 1110 include a channel region 1112, a source region 1114, and a drain region 1116. In some aspects, an oxide layer 1118 overlies the silicon layer 1106 and a gate electrode 1120 overlies the oxide layer 1118. The oxide layer 1118 acts as a gate insulator. The gate oxide layer 1118 is relatively thin compared to the gate electrode 1120 and the source/drain/channel regions.

The silicon layer 1106 includes a surface 1122 and the substrate 1105 includes a surface 1124. The surfaces 1122 and 1124 are generally in full contact. The discussion for FIG. 3 regarding the adaptability of silicon die 102 to non-planar surface features on the substrate 302 applies to the adaptability of stack structure 1102 to substrate 1105.

The substrate 1105 can be transparent or flexible, but is not limited to these materials. In some aspects, a transparent substrate 1105 is glass. A transparent substrate 1105 facilitates the use of an array of integrated circuit stack structures in display devices, such as devices with LCDs. In some aspects, a flexible substrate 1105 is plastic.

Function Description

The present invention provides a relatively inexpensive process for rapidly and precisely placing microscopically thin sheets of crystalline silicon onto non-silicon substrates for the purpose of making large area devices, especially display systems (e.g. display matrix and complementary signal process and control circuitry). The term "thin" indicates a thickness on the order of tens or hundreds of nm. Specifically, the present method can process a silicon sheet with a thickness of 20 nm. In addition, the present method includes a heat load that can be accommodated by low-cost substrates, for example, inexpensive glass or plastic materials.

The method produces die layers of crystalline semiconductor instead of polycrystalline material. The method rapidly and efficiently effects an exact and precise (i.e. non-random) placement of semiconductor layers having thickness as small as 20 nm without use of fluids. As noted in the Background Section, die placement depending on a liquid medium relies on random, gravitational movement and generally requires a die thickness in the tens of microns.

The method is simple and, therefore, relatively inexpensive. For example, the process does not require fluids, substrate processing outside of cleaning, nor high power lasers. Material is efficiently handled during the method. For example, only scribe lines are etched away, and the bulk of the crystalline semiconductor can be recycled.

FIG. 12 is a flowchart illustrating the present invention method for assembling crystalline semiconductor thin film dies onto substrates. Although the method in FIG. 12 (and FIGS. 13, 15, and 16 below) is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 1200. Step 1202 delineates an array of die areas on a crystalline semiconductor wafer with a first thickness. Step 1204 implants the die areas with hydrogen ions. Step 1206 implants ions such that a highest ion concentration is at a first depth less than the first thickness and greater than and equal to 20 nm. By that we mean the first depth can be 20 nm or more. Step 1208 overlies the die areas with a first layer of polymer to form, for each die, an aggregate including a polymer layer and a die area wafer first layer with the first thickness. Step 1210 polymerically bonds a first optically clear carrier overlying the die areas. Step 1212 thermally anneals the crystalline wafer to induce breakage in the wafer. Step 1214, for each die, forms an aggregate wafer second layer with a second thickness less than the first thickness. Step 1215 uses rapid thermal annealing to induce breakage across the crystalline wafer at the first depth of highest hydrogen ion concentration and induces the bulk of the wafer to break away from the aggregate, leaving, for each die, the aggregate wafer second layer attached to the first optically clear carrier. Step 1216 forms the wafer second layer with a second thickness of greater than and equal to approximately 20 nm. By that we mean the second layer can have a thickness of 20 nm or more. Step 1218 conformably attaches the aggregate wafer second layer to a substrate.

In some aspects, delineating an array of die areas on a crystalline semiconductor wafer in Step 1202 includes notching, to a second depth greater than the first depth, a rectangular crosshatch pattern on the wafer.

In some aspects, implanting the die areas with hydrogen ions in Step 1204 includes implanting the die areas with a mixture of hydrogen and boron ions. Then, breakage in Step 1212 can be induced at a lower temperatures, often 200° C. to 300° C., allowing the use of a wider selection of polymer adhesives in Step 1208.

Figure 13:
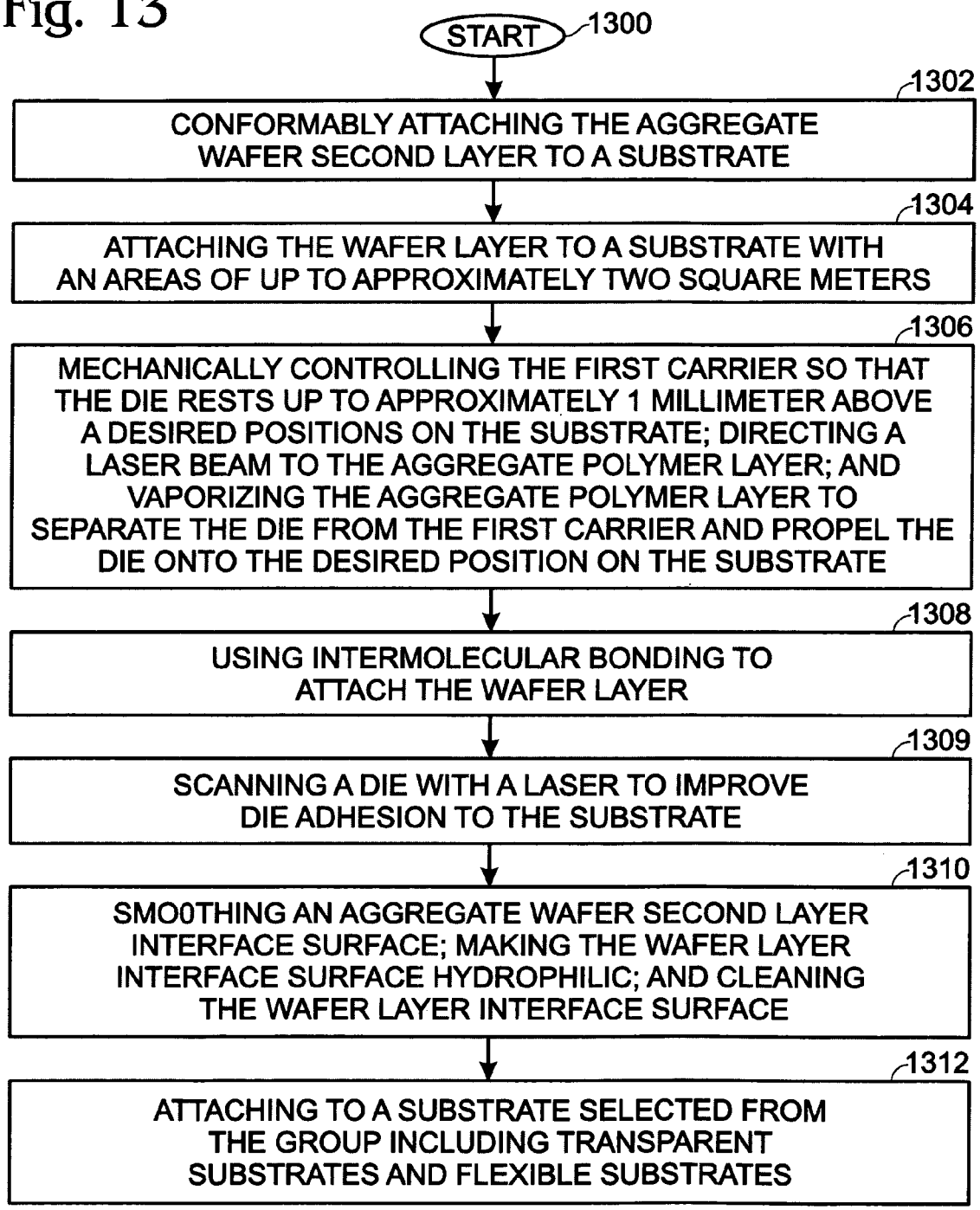
FIG. 13 is a flowchart further illustrating the method shown in FIG. 12.

FIG. 13 is a flow chart further illustrating the method shown in FIG. 12. The method starts with Step 1300. Step 1302 conformably attaches the aggregate wafer second layer to a substrate. Step 1304 attaches the wafer layer to a substrate with an area of up to approximately two square meters. Step 1306: mechanically controls the first carrier so that the die rests up to approximately one mm above a desired position on the substrate; directs a laser beam to the aggregate polymer layer; and vaporizes the aggregate polymer layer to separate the die from the first carrier and propel the die unto the desired position on the substrate. Step 1308 uses intermolecular bonding to attach the wafer layer. Step 1310 smoothes an aggregate wafer second layer interface surface, makes the wafer layer interface surface hydrophilic, and cleans the wafer layer interface surface. Step 1312 attaches to a substrate selected from the group including transparent substrates and flexible substrates.

In some aspects, conformably attaching the aggregate wafer second layer to a substrate in Step 1302 includes conformably attaching to a substrate interface surface with a concavity having a depth of up to one mm. See the discussion for FIG. 3 for further information regarding non-planar features, such as concavities, in substrate surfaces. In some aspects, a Step 1309 scans a die with a laser to improve die adhesion to the substrate, following the use of intermolecular bonding to attach the wafer layer in Step 1308.

Figure 14:
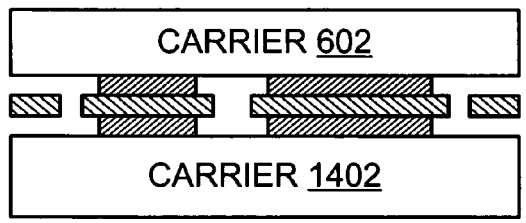
FIG. 14 is a partial cross-sectional view showing the transfer of the silicon layer to a second carrier and, after transfer, the removal of the first carrier and resin.

FIG. 14 is a partial cross-sectional view showing the transfer of the silicon layer to a second carrier and, after transfer, the removal of the first carrier and resin. In some aspects, smoothing the aggregate wafer layer interface surface in Step 1310 includes, as shown in FIG. 14: overlying a second optically clear carrier with a second layer of polymer; for each die, polymerically bonding an aggregate wafer second layer first surface to the second optically clear carrier; removing the first optically clear carrier from the aggregate; and, for each die, using an aggregate wafer second layer second surface underlying the first polymer layer as the aggregate wafer second layer interface surface.

In some aspects, if the aggregate layer surface roughness is in the order of nanometers or less, smoothing the aggregate wafer layer interface surface in Step 1310 includes inserting the aggregate into a hydrogen plasma heated to a few hundred degrees Celsius. In some aspects, making the wafer layer interface surface hydrophilic in Step 1310 includes attaching monolayers of either oxygen or hydroxyl groups. One example of the former process is inserting an aggregated stack into an oxidizing plasma. Another example of the former process is cleaning an aggregated stack with a heated solution of hydrogen peroxide and ammonium hydroxide mixed in water, known as SC1, and drying or dipping the aggregated stack in hydrogen peroxide and drying.

In some aspects, attaching to transparent substrates in Step 1312 includes attaching to glass substrates. In some aspects, attaching to flexible substrates in Step 1312 includes attaching to plastic substrates.

FIG. 15 is a flowchart illustrating the present invention method for assembling crystalline semiconductor thin film dies onto substrates. The method starts with Step 1500. Step 1502 implants, with hydrogen ions to a first depth of greatest ion concentration, a crystalline semiconductor wafer having a first thickness, the first depth less than the first thickness and greater than and equal to 20 nm. By that we mean the first depth can be 20 nm or more. Step 1504 overlies the crystalline wafer with a polymer to form an aggregate with a polymer layer and a wafer first layer with the first thickness. Step 1506 polymerically bonds an optically clear carrier overlying the aggregate. Step 1508 uses rapid thermal annealing to induce breakage in the wafer. Step 1510 forms an aggregate wafer second layer with a second thickness less than the first thickness. Step 1511 forms the wafer second layer with a second thickness of greater than and equal to approximately 20 nm. By that we mean the second thickness is 20 nm or more. Step 1512 forms an array of aggregate dies by notching the aggregate wafer second layer a second depth greater than the second thickness. Step 1514, for each die, conformably attaches the wafer second layer to a substrate. Step 1516, for each die, attaches the wafer second layer to a substrate with an area of up to two square meters.

The method of FIG. 15 is particularly applicable if Step 1508 produces breakage with a surface roughness of a few tens of nanometers. Then, in some aspects, conformably attaching the wafer second layer to a substrate in Step 1514 includes chemical mechanical polishing an aggregate layer surface. Typically, chemical mechanical polishing is followed by coating with photoresist, etching back with reactive ion etching using a gas mixture of halogen and oxygen, and stripping the photoresist and cleaning.

Figure 16:
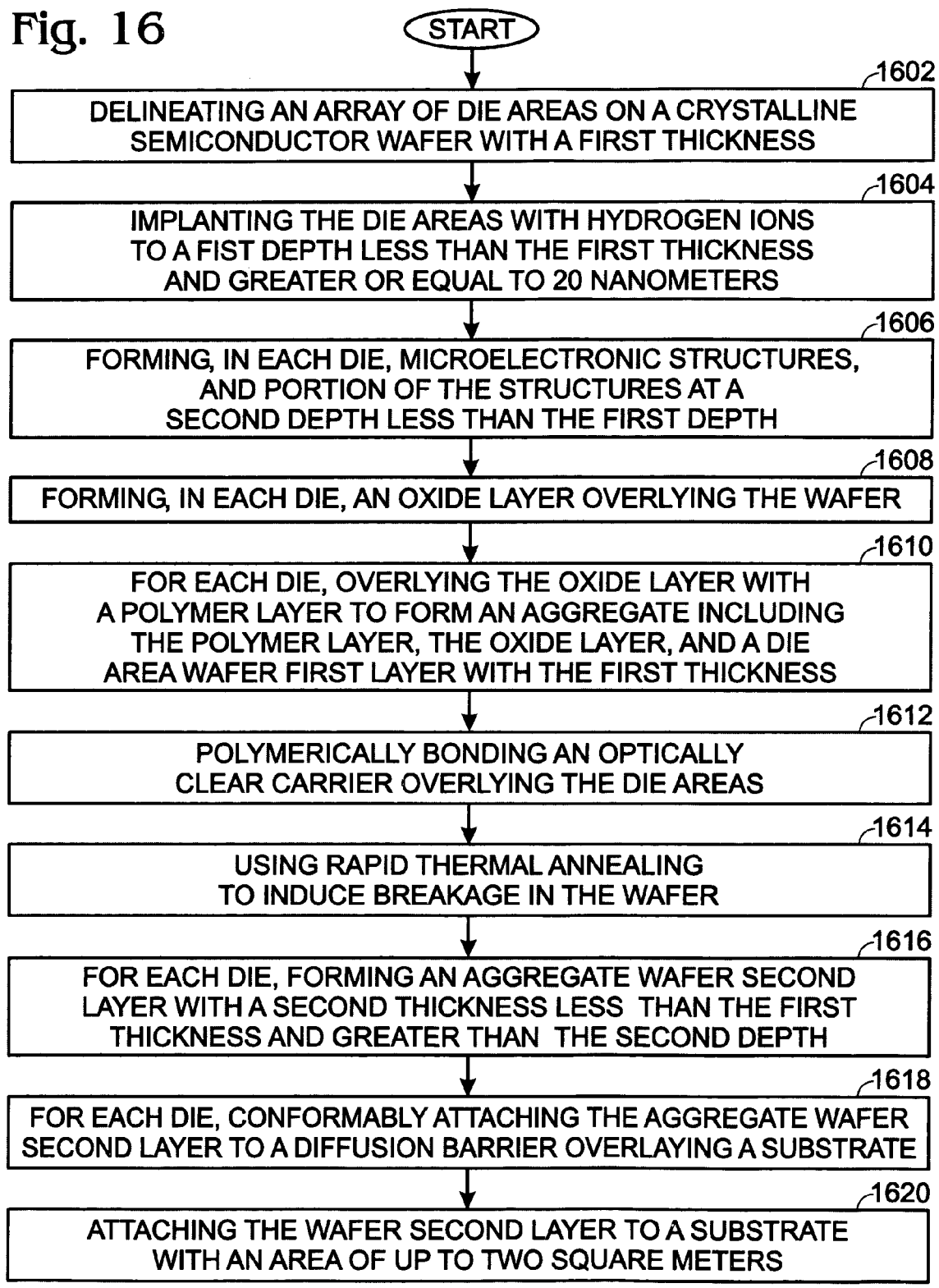
FIG. 16 is a flowchart illustrating the present invention method for assembling integrated circuit stacks onto substrates.

FIG. 16 is a flowchart illustrating the present invention method for assembling integrated circuit stacks onto substrates. The method starts with Step 1600. Step 1602 delineates an array of die areas on a crystalline semiconductor wafer with a first thickness. Step 1604 implants the die areas with hydrogen ions to a first depth less than the first thickness and greater than and equal to 20 nm. By that we mean the first depth can be 20 nm or more. Step 1606 forms, in each die, microelectronic structures, any portion of the structures at a second depth less than the first depth. Step 1608 forms, in each die, an oxide layer overlying the wafer. Step 1610, for each die, overlies the oxide layer with a polymer layer to form an aggregate including the polymer layer, the oxide layer, and a die area wafer first layer with the first thickness. Step 1612 polymerically bonds an optically clear carrier overlying the die areas. Step 1614 uses rapid thermal annealing to induce breakage in the wafer. Step 1616, for each die, forms an aggregate wafer second layer with a second thickness less than the first thickness and greater than the second depth. Step 1617 forms the wafer second layer with a second thickness of greater than and equal to approximately 20 nm. By that we mean the second layer can have a thickness of 20 nm or more. Step 1618, for each die, conformably attaches the aggregate wafer second layer to a diffusion barrier overlying a substrate. Step 1620 conformably attaches the wafer second layer to a substrate with an area of up to two square meters.

In some aspects, implanting hydrogen ions in Step 1604 can be performed after forming, in each die, an oxide layer overlying the wafer in Step 1608. In some aspects, forming, in each die, an oxide layer overlying the wafer in Step 1608 includes isotropically depositing the oxide. That is, uniformly overlying the wafer with an oxide layer. Then, the oxide is selectively etched, for example, etching to remove the oxide from die areas not including microelectronic structures formed in Step 1606. In some aspects, forming, in each die, an oxide layer overlying the wafer in Step 1608 includes anisotropically (i.e., selectively) depositing the oxide. For example, depositing oxide only over die areas with microelectronic structures formed in Step 1606.

In some aspects, conformably attaching in Step 1620 includes conformably attaching to a diffusion barrier interface surface with a concavity having a depth of up to one mm. See the discussion for FIG. 3 for further information regarding non-planar features, such as concavities, in substrate surfaces.

An array of crystalline silicon dies on a substrate has been described. A method for assembling crystalline semiconductor thin film dies onto substrates also has been described. The array and method have been described with respect to a backplane for flat screen display applications, such as LCD screens. However, the present invention is not limited to flat screen display applications. The present invention is applicable to a wide range of electronic applications involving silicon structures on a substrate, for example, a CCD camera system with analog-to-digital conversion and digital signal processing.

Examples have been provided of some material thicknesses and of some configurations, such as an integrated circuit stack structure. Likewise, some process specifics have been given to clearly explain the fundamental concepts. However, the present invention is not limited to just those thickness, configurations, or specifics. Other variations and embodiments of the present invention will occur to those skilled in the art.

Although the invention has been described with reference to particular embodiments, the description is only an example of the invention's application and should not be taken as a limitation. Consequently, various adaptations and combinations of features of the embodiments disclosed are within the scope of the invention as encompassed by the following claims.

We claim:

1. An array of crystalline silicon dies on a substrate comprising:
   a substrate with an area of up to approximately two square meters;
   a plurality of dies, each die having a thickness greater than or equal to approximately 20 nanometers:
   wherein each die includes a surface overlying and in full contact with a substrate surface; and,
   wherein the substrate surface includes a concavity with a depth of up to approximately one millimeter.

2. The array of claim 1 wherein the substrate is from the group including transparent and flexible substrates.

3. The array of claim 2 wherein the transparent substrate is glass.

4. The array of claim 2 wherein the flexible substrate is plastic.

* * * * *